United States Patent
Zou et al.

(10) Patent No.: US 9,197,185 B2
(45) Date of Patent: Nov. 24, 2015

(54) RESONATOR DEVICE INCLUDING ELECTRODES WITH BURIED TEMPERATURE COMPENSATING LAYERS

(75) Inventors: Qiang Zou, Fort Collins, CO (US); Zhiqiang Bi, Fort Collins, CO (US); Kristina Lamers, Fort Collins, CO (US); Richard C. Ruby, Menlo Park, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 434 days.

(21) Appl. No.: 13/601,384

(22) Filed: Aug. 31, 2012

(65) Prior Publication Data

US 2013/0049545 A1 Feb. 28, 2013

Related U.S. Application Data

(63) Continuation-in-part of application No. 12/769,791, filed on Apr. 29, 2010.

(51) Int. Cl.
| | |
|---|---|
| H03H 9/17 | (2006.01) |
| H03H 3/04 | (2006.01) |
| H03H 9/02 | (2006.01) |
| H03H 9/13 | (2006.01) |

(52) U.S. Cl.
CPC .............. *H03H 3/04* (2013.01); *H03H 9/02102* (2013.01); *H03H 9/131* (2013.01); *H03H 9/173* (2013.01); *H03H 9/175* (2013.01)

(58) Field of Classification Search
CPC ........ H03H 3/04; H03H 9/131; H01L 41/053; H01L 41/047; H01L 41/0926; H01L 41/083; H01L 41/39
USPC ............................ 310/346, 363, 364, 365, 366
See application file for complete search history.

(56) References Cited

U.S. PATENT DOCUMENTS

| | | | |
|---|---|---|---|
| 4,456,850 A | 6/1984 | Inoue et al. | |
| 5,587,620 A | 12/1996 | Ruby et al. | |
| 5,872,493 A | * 2/1999 | Ella | ............. 333/191 |
| 5,873,153 A | 2/1999 | Ruby et al. | |
| 5,956,292 A | 9/1999 | Bernstein | |

(Continued)

FOREIGN PATENT DOCUMENTS

| | | |
|---|---|---|
| JP | 58137317 | 8/1983 |
| JP | 58156220 | 9/1983 |

(Continued)

OTHER PUBLICATIONS

Co-pending U.S. Appl. No. 13/168,101, filed Jun. 24, 2011.

(Continued)

*Primary Examiner* — Shawki S Ismail
*Assistant Examiner* — Bryan Gordon

(57) ABSTRACT

An acoustic resonator includes a substrate and a first composite electrode disposed over the substrate. The first composite electrode includes first and second electrically conductive layers and a first temperature compensating layer disposed between the first and second electrically conductive layers. The second electrically conductive layer forms a first electrical contact with the first electrically conductive layer on at least one side of the first temperature compensating layer, and the first electrical contact electrically shorts a first capacitive component of the first temperature compensating layer.

49 Claims, 11 Drawing Sheets

(56) References Cited

U.S. PATENT DOCUMENTS

| | | | |
|---|---|---|---|
| 6,107,721 A | 8/2000 | Lakin | |
| 6,384,697 B1 | 5/2002 | Ruby | |
| 6,420,820 B1 | 7/2002 | Larson, III | |
| 6,441,539 B1 | 8/2002 | Kitamura et al. | |
| 6,507,983 B1 | 1/2003 | Ruby et al. | |
| 6,732,415 B2 | 5/2004 | Nakatani et al. | |
| 6,849,475 B2 | 2/2005 | Kim | |
| 6,906,451 B2 | 6/2005 | Yamada et al. | |
| 6,936,954 B2 | 8/2005 | Peczalski | |
| 7,212,082 B2 | 5/2007 | Nagao et a | |
| 7,259,498 B2 | 8/2007 | Nakatsuka et al. | |
| 7,280,007 B2 | 10/2007 | Feng et al. | |
| 7,345,410 B2* | 3/2008 | Grannen et al. | 310/364 |
| 7,358,831 B2* | 4/2008 | Larson et al. | 333/187 |
| 7,388,454 B2 | 6/2008 | Ruby et al. | |
| 7,391,285 B2* | 6/2008 | Larson et al. | 333/189 |
| 7,408,428 B2 | 8/2008 | Larson, III | |
| 7,508,286 B2 | 3/2009 | Ruby et al. | |
| 7,561,009 B2* | 7/2009 | Larson et al. | 333/187 |
| 7,561,010 B2 | 7/2009 | Hikita et al. | |
| 7,629,865 B2 | 12/2009 | Ruby | |
| 8,248,185 B2 | 8/2012 | Choy et al. | |
| 2006/0035471 A1 | 2/2006 | Hill et al. | |
| 2007/0120625 A1* | 5/2007 | Larson et al. | 333/189 |
| 2007/0205850 A1 | 9/2007 | Jamneala et al. | |
| 2007/0267942 A1 | 11/2007 | Matsumoto et al. | |
| 2010/0295631 A1 | 11/2010 | Coudrain et al. | |
| 2010/0327701 A1 | 12/2010 | Grannen et al. | |
| 2010/0327994 A1 | 12/2010 | Choy et al. | |
| 2011/0121916 A1 | 5/2011 | Barber et al. | |
| 2011/0227671 A1 | 9/2011 | Zhang | |
| 2011/0266925 A1* | 11/2011 | Ruby et al. | 310/346 |
| 2012/0050236 A1 | 3/2012 | Lo et al. | |
| 2012/0161902 A1 | 6/2012 | Feng et al. | |
| 2012/0218055 A1 | 8/2012 | Burak et al. | |
| 2012/0218056 A1 | 8/2012 | Burak | |
| 2012/0218058 A1 | 8/2012 | Burak et al. | |
| 2012/0218059 A1 | 8/2012 | Burak et al. | |
| 2012/0218060 A1 | 8/2012 | Burak et al. | |

FOREIGN PATENT DOCUMENTS

| | | |
|---|---|---|
| JP | 60016010 | 1/1985 |
| JP | 1158730 | 6/1989 |
| RU | 2066856 | 9/1996 |
| WO | WO 2010122024 | 10/2010 |

OTHER PUBLICATIONS

Zou, et al. "High Coupling Coefficient Temperature Compensated FBAR Resonator for Oscillator Application with Wide Pulling Range", 2010 IEEE International Frequency Control Symposium (FCS).

* cited by examiner

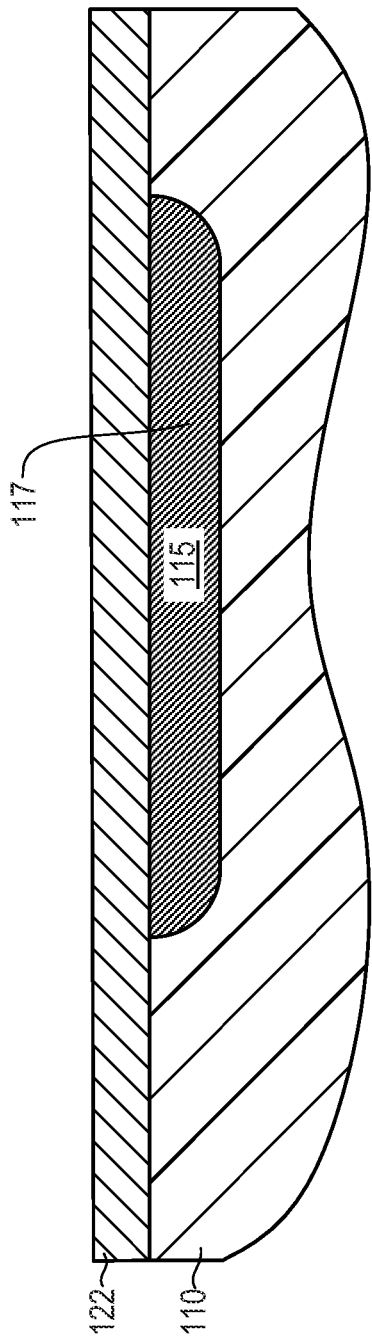
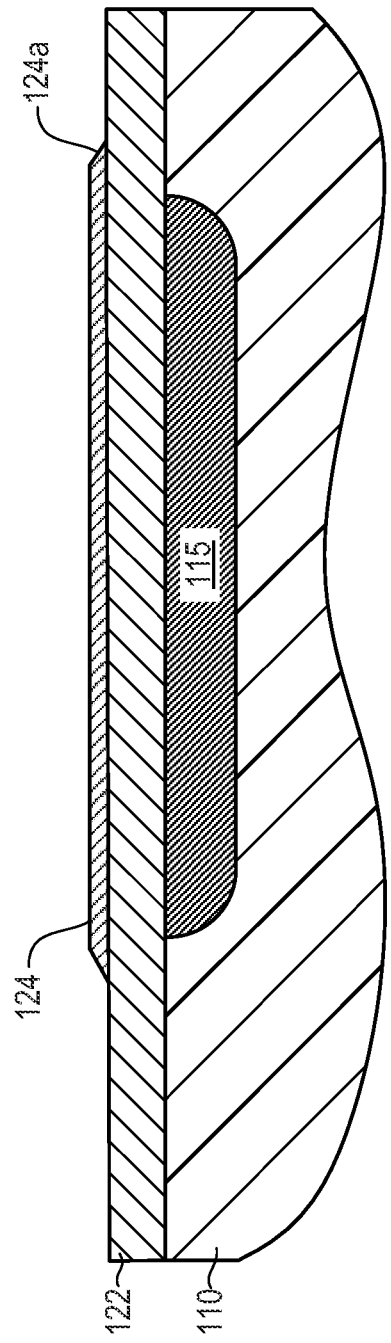
Fig. 3A
Fig. 3B

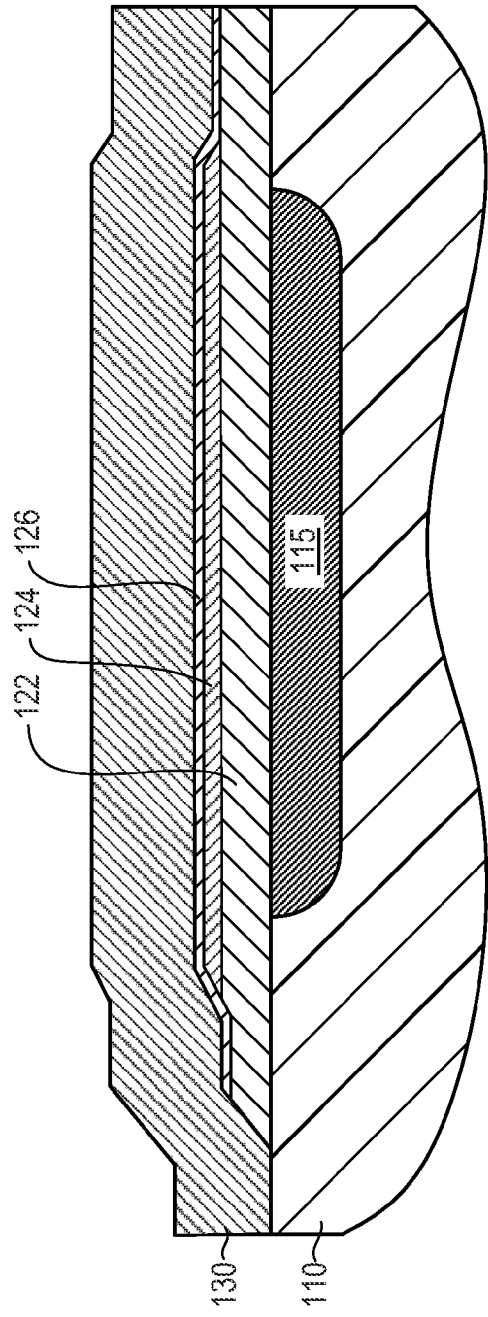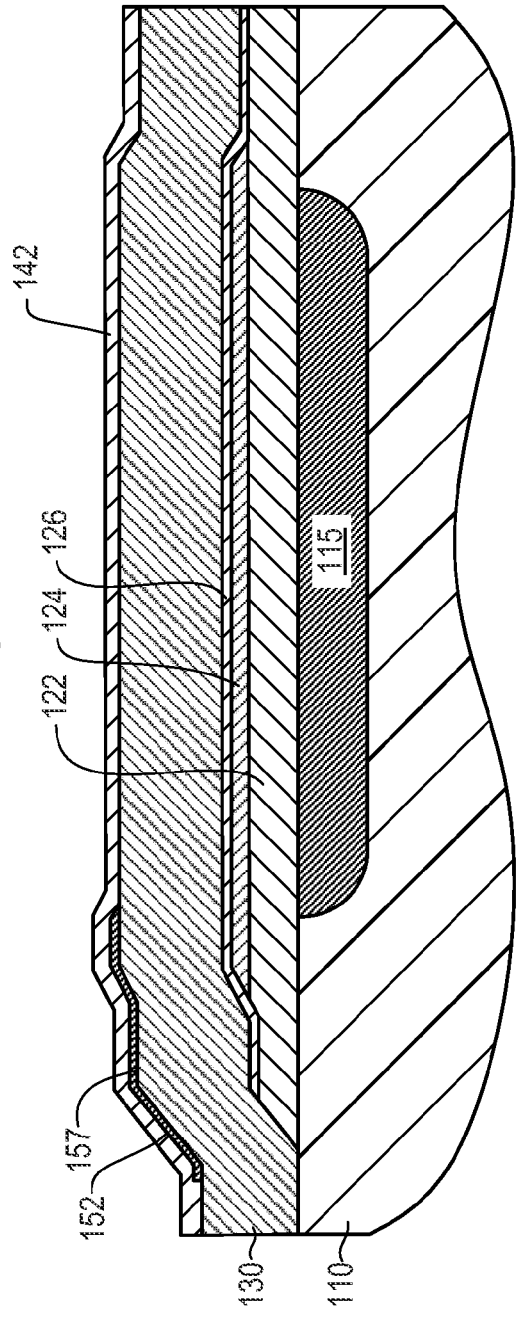

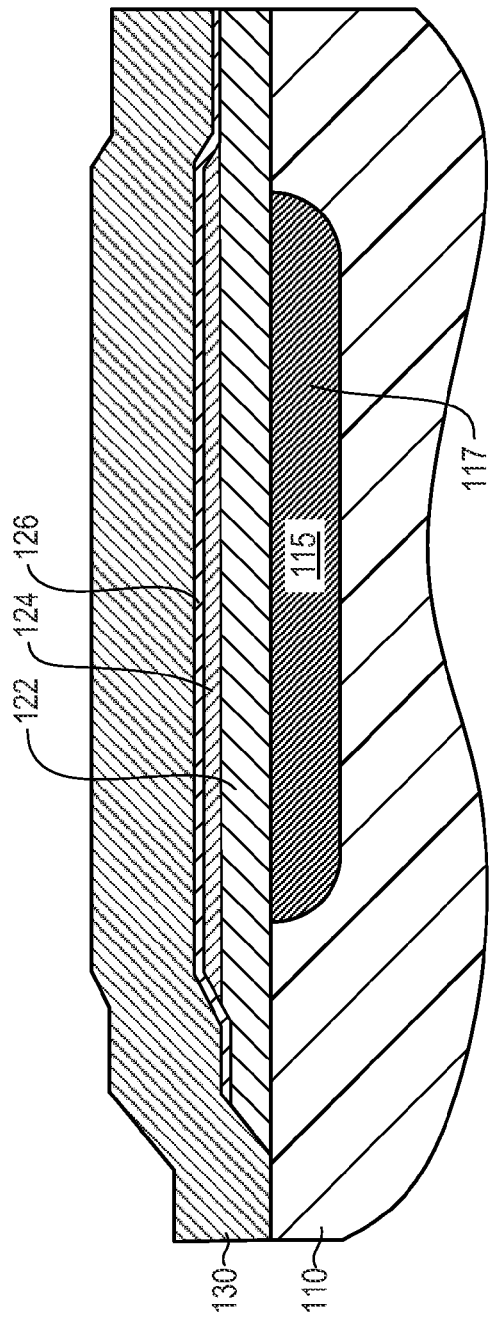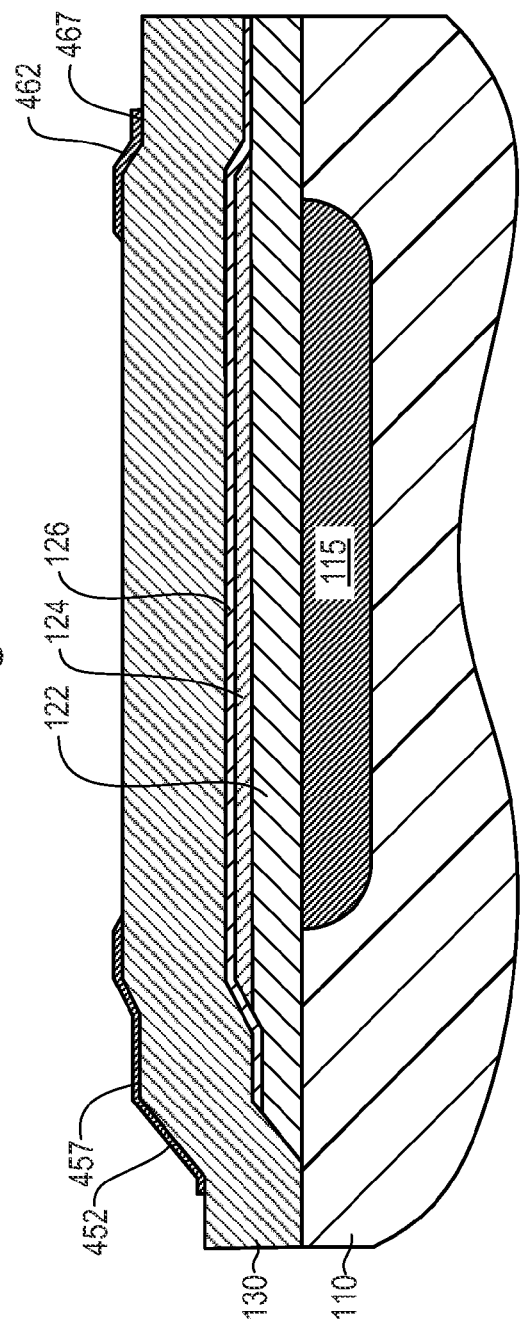

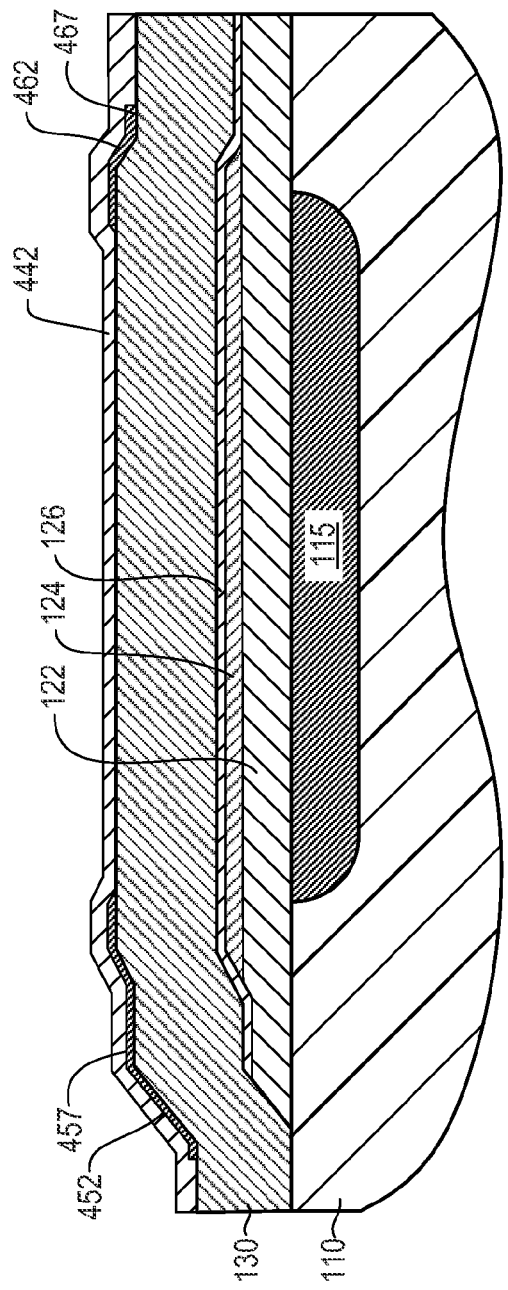
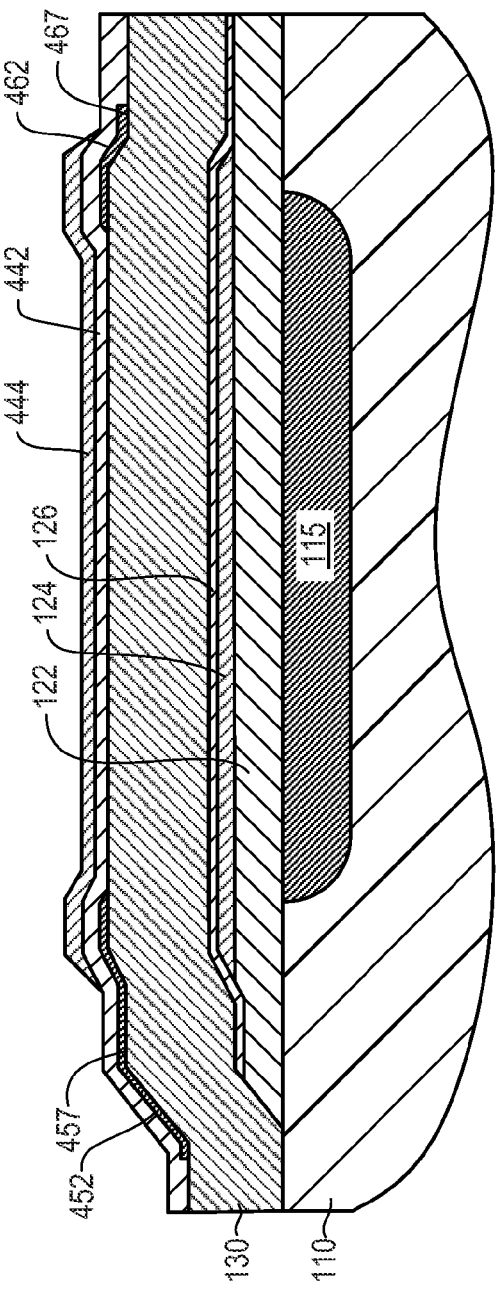

RESONATOR DEVICE INCLUDING ELECTRODES WITH BURIED TEMPERATURE COMPENSATING LAYERS

CROSS-REFERENCE TO RELATED APPLICATIONS

The present application is a continuation-in-part application under 37 C.F.R. §1.53(b) of commonly owned U.S. patent application Ser. No. 12/769,791 to Richard C. Ruby, et al., entitled "RESONATOR DEVICE INCLUDING ELECTRODE WITH BURIED TEMPERATURE COMPENSATING LAYER," filed on Apr. 29, 2010. Applicants claim priority under 35 U.S.C. §120 from U.S. patent application Ser. No. 12/769,791, and the entire disclosure of U.S. patent application Ser. No. 12/769,791 is hereby incorporated by reference.

BACKGROUND

Electrical resonators are widely incorporated in modern electronic devices. For example, in wireless communications devices, radio frequency (RF) and microwave frequency resonators are used as filters, such as ladder filters having electrically connected series and shunt resonators formed in a ladder structure. The filters may be included in a duplexer, for example, connected between a single antenna and a receiver and a transmitter for respectively filtering received and transmitted signals.

Various types of filters use mechanical resonators, such as bulk acoustic wave (BAW) resonators and surface acoustic wave (SAW) resonators. The resonators generally convert electrical signals to mechanical signals or vibrations, and/or mechanical signals or vibrations to electrical signals. A BAW resonator, for example, is an acoustic stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as a film bulk acoustic resonator (FBAR). FBARs resonate at GHz frequencies, and are thus relatively compact, having thicknesses on the order of microns, and length and width dimensions of hundreds of microns.

Resonators may be used as band-pass filters with associated passbands providing ranges of frequencies permitted to pass through the filters. The passbands of the resonator filters tend to shift in response to environmental and operational factors, such as changes in temperature and/or incident power. For example, the passband of a resonator filter moves lower in frequency in response to rising temperature and higher incident power.

Cellular phones, in particular, are negatively affected by shifts in passband due to fluctuations in temperature and power. For example, a cellular phone includes power amplifiers (PAs) that must be able to deal with larger than expected insertion losses at the edges of the filter (duplexer). As the filter passband shifts down in frequency, e.g., due to rising temperature, the point of maximum absorption of power in the filter, which is designed to be above the passband, moves down into the frequency range of the FCC or government designated passband. At this point, the filter begins to absorb more power from the PA and heats up, causing the temperature to increase further. Thus, the filter passband shifts down in frequency more, bringing the maximum filter absorbing point even closer. This sets up a potential runaway situation, which is avoided only by the fact that the reflected power becomes large and the filter eventually settles at some high temperature.

PAs are designed specifically to handle the worst case power handling of the filter at the corner of the pass band. Currents of a typical PA can run from a few mA at the center of the filter passband to about 380 mA-450 mA at the edges. This is a huge power draw on the PA, as well as the battery that drives the cellular phone. This is one reason that a cellular phone operating more in the transmit mode (i.e., talk time) than in the receive mode (i.e., listening time) drains battery power more quickly.

In order to prevent or reduce rising temperatures, a known filter may include a layer of oxide material within the piezoelectric layer of the acoustic stack. The oxide material has a positive temperature coefficient, which at least partially offsets the negative temperature coefficients of the metal electrodes and the piezoelectric material, respectively. For example, the oxide material may be placed in the center of the piezoelectric layer or at either end of the piezoelectric layer between the electrodes. However, that the acoustic coupling coefficient ($kt^2$) of the resonator is greatly compromised by the addition of oxide material to the piezoelectric layer. This is because the oxide material appears as a "dead" capacitor in series with the active piezoelectric material dielectric. Further, the oxide material may contaminate the piezoelectric material. For example, when the piezoelectric material is aluminum nitride (AlN), the oxide material causes the AlN to become a chemical compound that includes oxygen (e.g., $AlN_{(x)}O_{(y)}$), which is a non-piezoelectric material, thus further degrading the acoustic coupling coefficient.

What is needed, therefore, is a mechanical resonator that overcomes at least the deficiencies of known mechanical resonators described above.

SUMMARY

In a representative embodiment, an acoustic resonator includes a substrate and a first composite electrode disposed over the substrate. The first composite electrode includes first and second electrically conductive layers and a first temperature compensating layer disposed between the first and second electrically conductive layers. The second electrically conductive layer forms a first electrical contact with the first electrically conductive layer on at least one side of the first temperature compensating layer, and the first electrical contact electrically shorts a first capacitive component of the first temperature compensating layer. The acoustic resonator also includes a piezoelectric layer disposed over the first composite electrode, and a second composite electrode disposed over the piezoelectric layer. The second composite electrode includes third and fourth electrically conductive layers and a second temperature compensating layer disposed between the third and fourth electrically conductive layers. The fourth electrically conductive layer forms a second electrical contact with the third electrically conductive layer on at least one side of the second temperature compensating layer, and the second electrical contact electrically shorts a second capacitive component of the second temperature compensating layer. The acoustic resonator also includes an acoustic reflector disposed beneath the first composite electrode.

In another representative embodiment, an acoustic resonator device includes an acoustic resonator including a substrate, and a first composite electrode disposed over the substrate. The first composite electrode includes first and second electrically conductive layers and a first temperature compensating layer disposed between the first and second electrically conductive layers. The acoustic resonator also includes a piezoelectric layer disposed over the first composite electrode, the piezoelectric layer having a thickness, and a second composite electrode disposed over the piezoelectric layer. The second composite electrode includes third and fourth electrically conductive layers and a second temperature compensating layer disposed between the third and fourth electrically conductive layers. The acoustic resonator also includes an acoustic reflector disposed beneath the first composite electrode. The first and second composite electrodes are symmetrically disposed about an axis of symmetry passing substantially along a center of the thickness of the piezoelectric layer.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIGS. 3A-3G are cross-sectional diagrams depicting an illustrative fabrication sequence of an acoustic resonator device according to a representative embodiment.

FIGS. 5A-5E are cross-sectional diagrams depicting an illustrative fabrication sequence of an acoustic resonator device according to a representative embodiment.

DETAILED DESCRIPTION

Figure 1:
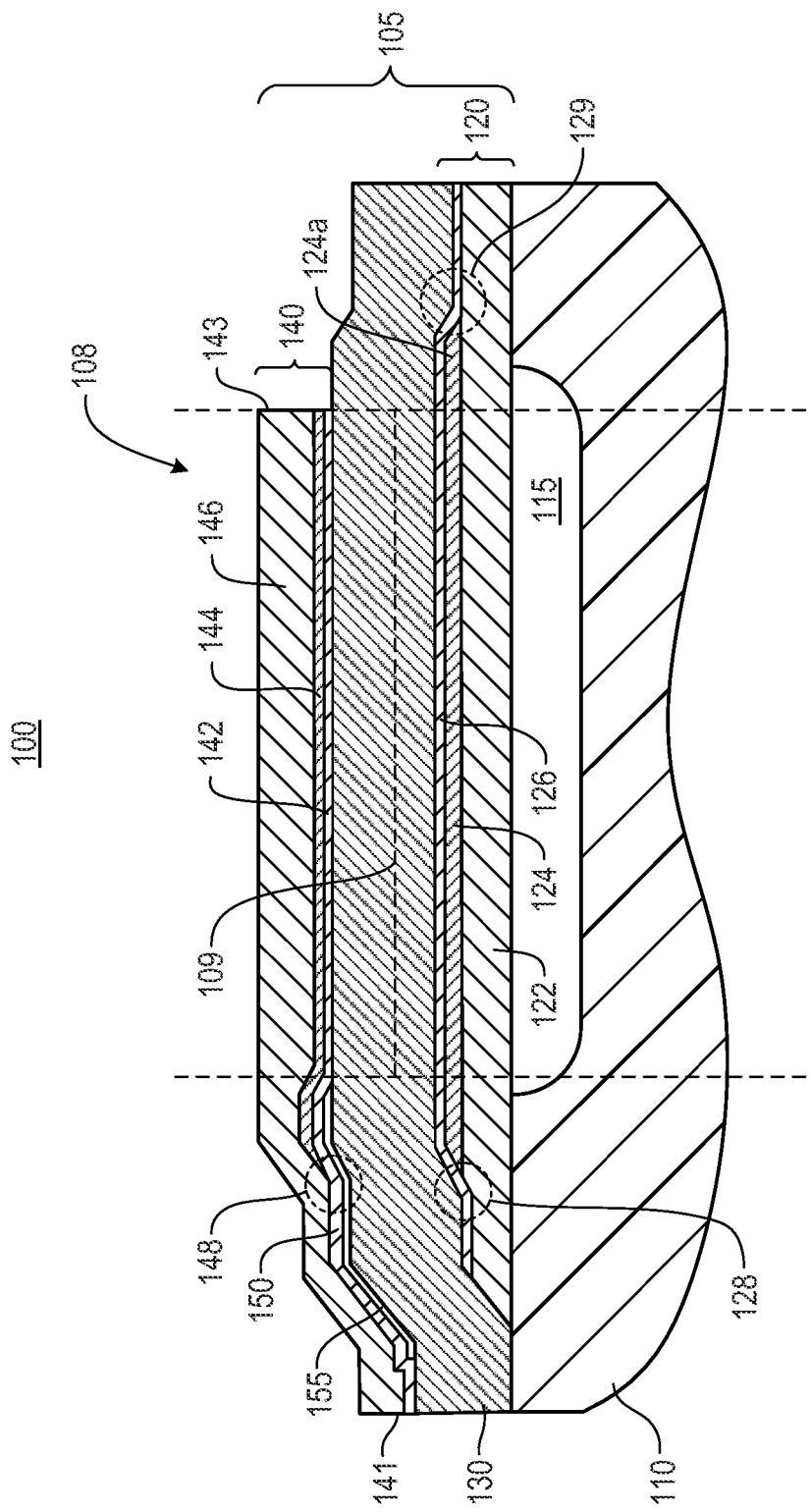
FIG. 1 is a cross-sectional diagram illustrating an acoustic resonator device according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Aspects of the present teachings are relevant to components of BAW and FBAR devices and filters, their materials and their methods of fabrication. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454 and 7,629,865 to Ruby et al.; U.S. Pat. No. 7,280,007 to Hongjun Feng et al.; U.S. Pat. No. 8,248,185 to Choy, et al.; U.S. Patent Application Pub. No. 20070205850 to Jamneala et al.; and U.S. Patent Application Pub. No. 20100327994 to Choy, et al. The disclosures of these patents and published patent applications are hereby incorporated by reference. It is emphasized that the components, materials and method of fabrication described in these patents and patent applications are representative and other methods of fabrication and materials within the purview of one of ordinary skill in the art are contemplated.

According to various embodiments, a resonator device has an acoustic stack with a piezoelectric layer between top and bottom composite electrodes, both of which have a temperature compensating layer deposited between electrically conductive layers, which may be referred to as a base electrode layer and a conductive interposer layer. Each of the temperature compensating layers may be formed of polycrystalline silicon or an oxide material, such as boron silicate glass (BSG), for example, having a positive temperature coefficient which offsets at least a portion of the negative temperature coefficients of the piezoelectric layer and the conductive material in the top and bottom composite electrodes. The conductive interposer layer thus makes a DC electrical connection with the electrode layer in each of the top and bottom composite electrodes, effectively shorting out capacitive components of the respective temperature compensating layers and increasing coupling coefficient $kt^2$ of the resonator device. Also, the conductive interposers, which are positioned between the temperature compensating layers and the piezoelectric layer, present barriers preventing oxygen, for example, from diffusing into the piezoelectric material of the piezoelectric layer.

FIG. 1 is a cross-sectional view of a BAW resonator device, and more particularly, an FBAR in the depicted illustrative configuration, which includes composite electrodes having buried temperature compensating layers, according to a representative embodiment.

Referring to FIG. 1, acoustic resonator device 100 includes acoustic stack 105 formed on substrate 110. The substrate 110 may be formed of various types of semiconductor materials compatible with semiconductor processes, such as silicon (Si), gallium arsenide (GaAs), indium phosphide (InP), or the like, which is useful for integrating connections and electronics, thus reducing size and cost. In the depicted embodiment, the substrate 110 includes an acoustic reflector, indicated by representative cavity 115 in the depicted embodiment, formed beneath the acoustic stack 105 to provide acoustic isolation. The acoustic stack 105 is suspended over an air space formed by the cavity 115 to enable mechanical movement. In alternative embodiments, the substrate 110 may be formed with no cavity 115, for example, using surface mounted resonator (SMR) technology. For example, the acoustic stack 105 may be formed over an acoustic mirror or a Bragg Reflector (not shown) formed on or in the substrate 110. The acoustic mirror or Bragg Reflector may have alternating layers of high and low acoustic impedance materials. An acoustic mirror may be fabricated according to various techniques, an example of which is described in U.S. Pat. No. 7,358,831 to Larson, III, et al., which is hereby incorporated by reference.

The acoustic stack 105 includes piezoelectric layer 130 formed between first composite electrode 120 and second composite electrode 140. The first composite electrode 120 includes a first base electrode layer or first electrically conductive layer 122, a buried first temperature compensating layer 124, and a second conductive interposer layer or second electrically conductive layer 126, stacked sequentially on the substrate 110 over the cavity 115. The first and second electrically conductive layers 122 and 126 are formed of electrically conductive materials, such as various metals compatible with semiconductor processes, including tungsten (W), molybdenum (Mo), aluminum (Al), platinum (Pt), ruthenium (Ru), niobium (Nb), or hafnium (Hf), for example.

In various embodiments, the first electrically conductive layer 122 and the second electrically conductive layer 126 are formed of different conductive materials, where the first electrically conductive layer 122 is formed of a material having relatively lower conductivity and relatively higher acoustic impedance, and the second electrically conductive layer 126 is formed of a material having relatively higher conductivity and relatively lower acoustic impedance. For example, the first electrically conductive layer 122 may be formed of W and the second electrically conductive layer 126 may be formed of Mo, although other materials and/or combinations of materials may be used without departing from the scope of the present teachings. Further, in various embodiments, the first electrically conductive layer 122 and the second electrically conductive layer 126 may be formed of the same conductive material, without departing from the scope of the present teachings.

The buried first temperature compensating layer 124 is formed between the first electrically conductive layer 122 and the second electrically conductive layer 126. The buried first temperature compensating layer 124 is therefore separated or isolated from the piezoelectric layer 130 by the second electrically conductive layer 126, and is otherwise sealed in by the connection between the second electrically conductive layer 126 and the first electrically conductive layer 122. Accordingly, the buried first temperature compensating layer 124 is effectively buried within the first composite electrode 120. The buried first temperature compensating layer 124 may be formed of various materials compatible with semiconductor processes, including polycrystalline silicon, boron silicate glass (BSG), silicon dioxide ($SiO_2$), chromium (Cr) or tellurium oxide ($TeO_{(x)}$), for example, which have positive temperature coefficients. The positive temperature coefficient of the buried first temperature compensating layer 124 offsets negative temperature coefficients of other materials in the acoustic stack 105, including the piezoelectric layer 130, the second composite electrode 140, the first electrically conductive layer 122 and the second electrically conductive layer 126 of the first composite electrode 120.

As shown in the embodiment of FIG. 1, the buried first temperature compensating layer 124 does not extend the full width of the acoustic stack 105. Thus, the second electrically conductive layer 126, which is formed on the top and side surfaces of the buried first temperature compensating layer 124, contacts the top surface of the first electrically conductive layer 122, as indicated for example by reference numerals 128 and 129. Therefore, DC electrical connections are formed between the second electrically conductive layer 126 and the first electrically conductive layer 122. By DC electrically connecting with the first electrically conductive layer 122, the second electrically conductive layer 126 effectively "shorts" out a capacitive component of the buried first temperature compensating layer 124, thus increasing a coupling coefficient ($kt^2$) of the acoustic resonator device 100. In addition, the second electrically conductive layer 126 provides a barrier between the buried first temperature compensating layer 124 and the piezoelectric layer 130, e.g., preventing oxygen from diffusing into the piezoelectric layer 130 when the buried first temperature compensating layer 124 contains oxygen.

Also, in the depicted embodiment, the buried first temperature compensating layer 124 has tapered edges 124a, which enhance the DC electrical connection between the second electrically conductive layer 126 and the first electrically conductive layer 122. In addition, the tapered edges 124a enhance the mechanical connection between the second electrically conductive layer 126 and the first electrically conductive layer 122, which improves the sealing quality, e.g., for preventing oxygen in the buried first temperature compensating layer 124 from diffusing into the piezoelectric layer 130. In alternative embodiments, the edges of the buried first temperature compensating layer 124 are not tapered, but may be substantially perpendicular to the top and bottom surfaces of the buried first temperature compensating layer 124, for example, without departing from the scope of the present teachings.

The piezoelectric layer 130 is formed on the top surface of the second electrically conductive layer 126. The piezoelectric layer 130 may be formed of a thin film piezoelectric compatible with semiconductor processes, such as aluminum nitride (AlN), zinc oxide (ZnO), lead zirconium titanate (PZT), or the like. The thickness of the piezoelectric layer 130 may range from about 1000 Å to about 100,000 Å, for example, although the thickness may vary to provide unique benefits for any particular situation or to meet application specific design requirements of various implementations, as would be apparent to one of ordinary skill in the art. In an embodiment, the piezoelectric layer 130 may be formed on a seed layer (not shown) disposed over an upper surface the first composite electrode 120. For example, the seed layer may be formed of Al to foster growth of an AlN piezoelectric layer 130. The seed layer may have a thickness in the range of about 50 Å to about 5000 Å, for example.

The second composite electrode 140 is formed on the top surface of the piezoelectric layer 130. The second composite electrode 140 includes a second conductive interposer layer or third electrically conductive layer 142, a buried second temperature compensating layer 144, and a second base electrode layer or fourth electrically conductive layer 146, stacked sequentially on the piezoelectric layer 130. The third and fourth electrically conductive layers 142 and 146 are formed of electrically conductive materials, such as various metals compatible with semiconductor processes, including W, Mo, Al, Pt, Ru, Nb, or Hf, for example. In various embodiments, the third electrically conductive layer 142 and the fourth electrically conductive layer 146 are formed of different conductive materials, where the fourth electrically conductive layer 146 is formed of a material having relatively lower conductivity and relatively higher acoustic impedance, and the third electrically conductive layer 142 is formed of a material having relatively higher conductivity relatively lower acoustic impedance. For example, the fourth electrically conductive layer 146 may be formed of W and the third electrically conductive layer 142 may be formed of Mo, although other materials and/or combinations of materials may be used without departing from the scope of the present teachings. Further, in various embodiments, the third electrically conductive layer 142 and the fourth electrically conductive layer 146 may be formed of the same conductive material, without departing from the scope of the present teachings. The third and fourth electrically conductive layers 142 and 146 may be formed of the same or different materials than the first and second electrically conductive layers 122 and 126 of the first composite electrode 120, without departing from the scope of the present teachings.

The buried second temperature compensating layer 144 is formed between the third electrically conductive layer 142 and the fourth electrically conductive layer 146. The buried second temperature compensating layer 144 is therefore separated or isolated from the piezoelectric layer 130 by the third electrically conductive layer 142. Accordingly, the buried second temperature compensating layer 144 is effectively buried within the second composite electrode 140, with the exception of an exposed outer edge, discussed below. The buried second temperature compensating layer 144 may be formed of various materials compatible with semiconductor processes, including polycrystalline silicon, BSG, $SiO_2$, Cr or $TeO_{(x)}$, for example, which have positive temperature coefficients. The positive temperature coefficient of the buried second temperature compensating layer 144 further offsets negative temperature coefficients of other materials in the acoustic stack 105, including the piezoelectric layer 130, the first composite electrode 120, and the third and fourth electrically conductive layers 142 and 146 of the second composite electrode 140.

As shown in the embodiment of FIG. 1, the second composite electrode 140 has a connection edge 141 and a non-connection edge 143. The connection edge 141 is on a side of the second composite electrode 140 configured to electrically connect to circuitry (not shown) to provide electrical signals to and/or from the acoustic resonator device 100. Also, a portion of the second composite electrode 140 extending toward the connection edge 141 includes bridge 150 over air gap 155. The bridge 150 is formed between the top surface of the piezoelectric layer 130 and the bottom surface of the second composite electrode 140 (more particularly, the bottom surface of the third electrically conductive layer 142). The acoustic stack 105 includes an active area 108, indicated by dashed lines. The active area 108 is terminated at the beginning of the bridge 150 and at the non-connection edge 143 of the second composite electrode 140. The bridge 150 effectively separates a dead resonator area of the acoustic resonator device 100 from the active area 108. It is noted that although the bridge 150 provides improved performance to the acoustic resonator device 100 (see for example the above-referenced patent and patent application to Choy, et al.), the bridge 150 is not essential to the acoustic resonator device 100, and the present teachings contemplate acoustic resonators that do not include the bridge 150.

The acoustic stack 105 within the active area 108 is substantially symmetrical about horizontal axis 109, which passes substantially along the center of a thickness of the piezoelectric layer 130. Notably, various factors such as manufacturing processes and application of seeding, mass loading and/or passivation layers (discussed below) may cause slight differences in structure on either side of the horizontal axis 109, such that the acoustic stack 105 may not be precisely symmetrical about the horizontal axis 109. Generally, though, the acoustic stack 105 within the active area 108 is more symmetrical than in a resonator device having only one composite electrode. As a result of the improved symmetry, negative effects of the second overtone are reduced or minimized in acoustic resonators according to the present teachings (e.g., acoustic resonator device 100) compared to a known acoustic resonator.

Figure 2:
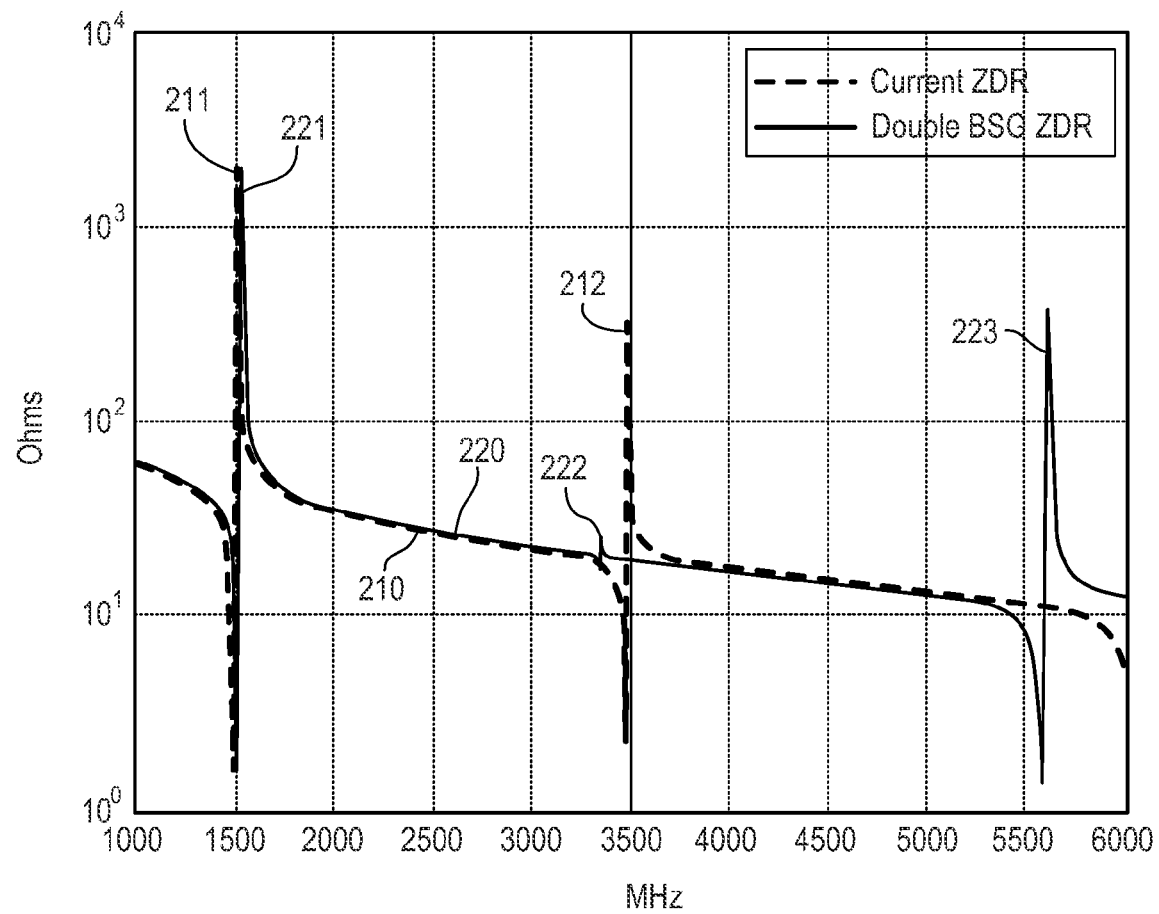
FIG. 2 shows a graph comparing frequency response of a known acoustic resonator and an acoustic resonator in accordance with a representative embodiment.

For example, FIG. 2 shows a graph comparing frequency response of a known acoustic resonator and an acoustic resonator in accordance with a representative embodiment. Referring to FIG. 2, the horizontal axis depicts frequency in MHz and the vertical axis depicts impedance in Ohms.

Trace 210 shows the frequency response of an acoustic resonator having one composite electrode. Trace 210 includes a first mode 211 at about 1500 MHz (corresponding to resonate frequency) and a second overtone spurious mode 212 at about 3500 MHz. In comparison, trace 220 shows the frequency response of an acoustic resonator having two composite electrodes, such as acoustic resonator device 100, according to a representative embodiment. Like trace 210, trace 220 includes a first mode at about 1500 MHz (corresponding to resonate frequency) and a second overtone spurious mode 222 at about 3500 MHz. However, the second overtone spurious mode 222 has been significantly suppressed (minimized). The trace 220 also includes higher order spurious mode 223 that occurs at about 5600 MHz, not seen in the trace 210. However, this frequency is well outside the frequency band of interest, and therefore does not negatively impact operation of the acoustic resonator device 100.

Generally, the more precisely symmetrical the acoustic stack 105 is about the horizontal axis 109, the better the suppression of the second overtone spurious mode 222, and ultimately, the better the performance of the acoustic resonator device 100 of the representative embodiment.

Referring again to FIG. 1, the fourth electrically conductive layer 146, which is formed on the top surface of the buried second temperature compensating layer 144, contacts the top surface of the third electrically conductive layer 142, as indicated for example by reference numeral 148. Therefore, a DC electrical connection is formed between the third electrically conductive layer 142 and the fourth electrically conductive layer 146. By DC electrically connecting with the third electrically conductive layer 142, the fourth electrically conductive layer 146 effectively "shorts" out a capacitive component of the buried second temperature compensating layer 144, thus further increasing the coupling coefficient ($kt^2$) of the acoustic resonator device 100. In addition, the third electrically conductive layer 142 provides a barrier between the buried second temperature compensating layer 144 and the piezoelectric layer 130, e.g., preventing oxygen from diffusing into the piezoelectric layer 130 when the buried second temperature compensating layer 144 contains oxygen. In the depicted embodiment, the fourth electrically conductive layer 146 does not connect with the third electrically conductive layer 142 at the non-connection edge 143 of the second composite electrode 140. Accordingly, an edge portion of the buried second temperature compensating layer 144 is exposed.

Also, in the depicted embodiment, the buried second temperature compensating layer 144 has tapered edge 144a, which enhances the DC electrical connection between the third and fourth electrically conductive layers 142 and 146. In addition, the tapered edge 144a enhances the mechanical connection between the fourth electrically conductive layer 146 and the third electrically conductive layer 142. In alternative embodiments, the edges of the buried second temperature compensating layer 144 are not tapered, but may be substantially perpendicular to the top and bottom surfaces of the buried second temperature compensating layer 144, for example, without departing from the scope of the present teachings.

The second composite electrode 140 may further include a passivation layer (not shown) on a top surface, which may be formed of various types of materials, including AlN, silicon carbide (SiC), BSG, $Si_{O2}$, SiN, polysilicon, and the like. The thickness of the passivation layer must be sufficient to insulate all layers of the acoustic stack 105 from the environment, including protection from moisture, corrosives, contaminants, debris and the like. The first and second composite electrodes 120 and 140 may be electrically connected to external circuitry via contact pads (not shown), which may be formed of a conductive material, such as gold, gold-tin alloy or the like.

In an embodiment, an overall first thickness of the first composite electrode 120 is substantially the same as an overall second thickness of the second composite electrode 140, as shown in FIG. 1. For example, the thickness of each of the first and second composite electrodes 120 and 140 may range from about 600 Å to about 30000 Å, although the thicknesses may vary to provide unique benefits for any particular situation or to meet application specific design requirements of various implementations, as would be apparent to one of ordinary skill in the art.

The multiple layers of each of the first and second composite electrodes 120 and 140 also have corresponding thicknesses. For example, the thickness of the first and fourth electrically conductive layers 122 and 146 may range from about 400 Å to about 29,900 Å, the thickness of the buried first and second temperature compensating layers 124 and 144 may range from about 100 Å to about 5000 Å, and the thickness of second and third electrically conductive layers 126 and 142 may range from about 100 Å to about 10000 Å. Each of the layers of the first and second composite electrodes 120 and 140 may be varied to produce different characteristics with respect to temperature coefficients and coupling coefficients, while the overall thicknesses of the first and second composite electrodes 120 and 140 remain substantially the same. For example, the thicknesses of the buried first and second temperature compensating layers 124 and 144 may be varied to affect the overall temperature coefficient of the acoustic stack 105, and the relative thicknesses of the first through fourth electrically conductive layers 122, 126, 142 and 146 may be varied to affect the overall coupling coefficient of the acoustic resonator device 100.

For example, thicknesses of the first through fourth electrically conductive layers 122, 126, 142 and 146 may be varied in order to "sink" the respective buried first and second temperature compensating layers 124 and 144 deeper into the corresponding first and second composite electrodes 120 and 140 (i.e., moved further away from the piezoelectric layer 130). That is, while the overall thicknesses of the first and second composite electrodes 120 and 140 remain substantially the same, the thicknesses of the second and third electrically conductive layers 126 and 142 (the conductive interposer layers) may be increased and the first and fourth electrically conductive layers 122 and 146 (the base electrode interposer layers) may be decreased, such that the buried first and second temperature compensating layers 124 and 144 become buried more deeply within the first and second composite electrodes 120 and 140, respectively. Also, the thicknesses of the buried first and second temperature compensating layers 124 and 144 can be targeted to be thicker (as they are buried more deeply) to help maintain, or minimize, the linear temperature coefficient. For example, burying the buried first and second temperature compensating layers 124 and 144 more deeply causes the coupling coefficient of the acoustic resonator device 100 to be relatively greater (at the expense of worsening temperature coefficient), while thickening the buried first and second temperature compensating layers 124 and 144 improves the temperature coefficient.

Generally, the thickness and location of each of the buried first and second temperature compensating layers 124 and 144 inside the first and second composite electrodes 120 and 140 should be optimized, in order to maximize the coupling coefficient for an allowable linear temperature coefficient. This optimization may be accomplished, for example, by modeling an equivalent circuit of the acoustic stack 105 using a Mason model and adjusting the buried first and second temperature compensating layers 124 and 144, and adding more material to the second and third electrically conductive layers 126 and 142 and removing material from the first and fourth electrically conductive layers 122 and 146, so the overall thicknesses of the first and second composite electrodes 120 and 140 remain constant, as would be apparent to one of ordinary skill in the art. An algorithm may be developed to optimize the depth of the buried first and second temperature compensating layers 124 and 144 in light of the trade-off between the temperature coefficient and the coupling coefficient, for example, using a multivariate optimization technique, such as a Simplex method, as would be apparent to one of ordinary skill in the art. In addition, the depth of the buried first and second temperature compensating layers 124 and 144 may be limited by various constraints, such as minimum necessary coupling coefficient and maximum allowable temperature coefficient. Likewise, the thicknesses of the buried first and second temperature compensating layers 124 and 144 may adjusted to provide the optimal coupling coefficient and a minimum overall temperature coefficient of the acoustic resonator device 100.

According to various embodiments, the resonator device may be fabricated using various techniques compatible with semiconductor processes. A non-limiting example of a fabrication process directed to representative acoustic resonator device 100 is discussed below with reference to FIGS. 3A-3G, which are cross-sectional views of a BAW resonator device in various stages of the fabrication process, according to a representative embodiment.

FIG. 3A shows substrate 110 defining cavity 115, and first electrically conductive layer 122 is applied to a top surface of the substrate 110. In the depicted embodiment, the cavity 115 is formed in the substrate 110 and is initially filled with a sacrificial material 117, such as phosphosilicate glass (PSG) or polysilicon, which is released using a suitable etchant later in the fabrication process, e.g., after application of the layers of the acoustic stack 105, as would be apparent to one of ordinary skill in the art. In alternative configurations, the cavity 115 may pass through the substrate 110 to form a backside opening, which may be formed by back side etching a bottom surface of the substrate 110. The back side etching may include a dry etch process, such as a Bosch process, for example, although various alternative techniques may be incorporated. The cavities may be formed by a number of known methods, examples of which are described in U.S. Pat. No. 6,384,697 to Ruby et al., which is hereby incorporated by reference.

Alternatively, an acoustic isolator, such as an acoustic mirror or Bragg Reflector, may be included in or formed on a top surface of the substrate 110, rather than the cavity 115. Such acoustic isolator may be formed using any technique compatible with semiconductor processes before forming the acoustic stack 105, as would be apparent to one of ordinary skill in the art. Examples of fabricating acoustic mirrors for a resonator device are described in U.S. Patent App. Pub. No. 2011/0121916 to Barber et al., which is hereby incorporated by reference.

In an embodiment, the substrate 110 is formed of Si and the first electrically conductive layer 122 is formed of W, for example, although different materials may be used, as discussed above, without departing from the scope of the present teachings. The first electrically conductive layer 122 may be applied using spin-on, sputtering, evaporation, physical vapor deposition (PVD) or chemical vapor disposition (CVD) techniques, for example, although other application methods may be incorporated.

Referring to FIG. 3B, buried first temperature compensating layer 124 is formed on a top surface of the first electrically conductive layer 122. In an embodiment, the buried first temperature compensating layer 124 is formed of polycrystalline silicon, for example, although different materials may be used, as discussed above, without departing from the scope of the present teachings. The buried first temperature compensating layer 124 may be applied using spin-on, sputtering, evaporation, PVD or CVD techniques, for example, although other application methods may be incorporated. Various illustrative techniques for forming temperature compensating layers are described, for example, in U.S. Pat. No. 7,561,009 to Larson, III, et al., which is hereby incorporated by reference.

A mask pattern (not shown) is then applied to the buried first temperature compensating layer 124, which is then etched to the desired size as depicted in FIG. 3B. This includes formation of the tapered edges 124a, discussed above. For example, a photoresist layer (not shown) may be applied to the top surface of the buried first temperature compensating layer 124 and patterned to form a mask or photoresist pattern, using any phostoresist patterning technique compatible with semiconductor processes, as would be apparent to one of ordinary skill in the art. The photoresist pattern may be formed by machining or chemically etching the photoresist layer using photolithography, although various alternative techniques may be incorporated. Following etching of the buried first temperature compensating layer 124, the photoresist pattern is removed, for example, by chemically releasing or etching using a wet etch process including HF etch solution, although the photoresist pattern may be removed by various other techniques, without departing from the scope of the present teachings.

In various embodiments, to obtain the tapered edges 124a, oxygen is leaked into the etcher used to etch the buried first temperature compensating layer 124. The oxide (and/or temperature chuck) causes the photoresist to erode more quickly at the edges of the patterned photo resist and to pull back slightly. This "thinning" of the resist forms a wedge shaped profile that is then imprinted into the oxide underneath as the photoresist goes away. Generally, the wedge is created by adjusting the etch rate of resist relative to the etched material, as would be apparent to one of ordinary skill in the art. Meanwhile, further from the edges of the buried first temperature compensating layer 124, there is sufficient photoresist coverage throughout the etch that the underlying oxide material is not touched. Of course, other methods of obtaining tapered edges may be incorporated without departing form the scope of the present teachings.

Figure 3C:
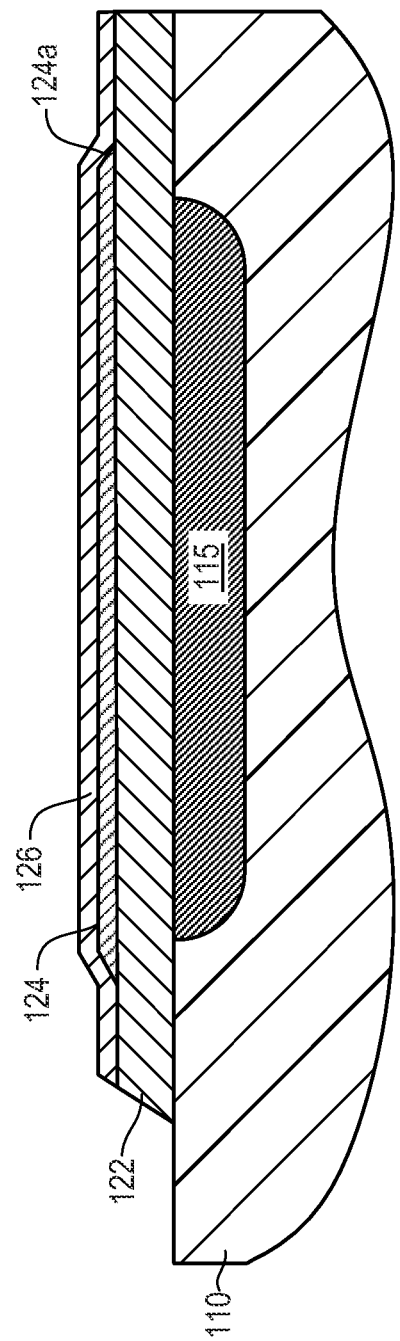

The second electrically conductive layer 126 is applied to a top surface of the buried first temperature compensating layer 124, as shown in FIG. 3C. The second electrically conductive layer 126 is formed of Mo, for example, although different materials may be used, as discussed above, without departing from the scope of the present teachings. The second electrically conductive layer 126 may be applied using spin-on, sputtering, evaporation, PVD or CVD techniques, for example, although other application methods may be incorporated. A mask pattern (not shown) is then applied to the structure, which is then etched to remove portions of the first and second electrically conductive layers 122 and 126 on the left side to form the desired shape and size as depicted in FIG. 3C. The mask is then removed. As discussed above, any masking and etching technique compatible with semiconductor processes may be incorporated, as would be apparent to one of ordinary skill in the art.

In an alternative embodiment, an interim seed layer (not shown) is formed on the top surface of the buried first temperature compensating layer 124 before the buried first temperature compensating layer 124 is etched. The interim seed layer may be formed of the same piezoelectric material as the piezoelectric layer 130, such as AlN, for example. The interim seed layer may be formed to a thickness of about 300 Å, for example, and reduces or minimizes oxide diffusion from the buried first temperature compensating layer 124 into the piezoelectric layer 130. Outer portions of the interim seed layer are removed by etching, along with the etched portions of the buried first temperature compensating layer 124, to expose portions of the top surface of the first electrically conductive layer 122, so that the first electrically conductive layer 122 is able to make an electrical connection between with the second electrically conductive layer 126. In other words, after etching, the interim seed layer covers only the top surface of the buried first temperature compensating layer 124, so that it is positioned between the buried first temperature compensating layer 124 and the second electrically conductive layer 126.

Referring to FIG. 3D, the piezoelectric layer 130 is formed on a top surface of the second electrically conductive layer 126, which is also the top surface of the first composite electrode 120. The piezoelectric layer 130 is formed of AlN, for example, although different materials may be used, as discussed above, without departing from the scope of the present teachings. The piezoelectric layer 130 may be applied using a sputtering technique, for example, although other application methods may be incorporated. For example, the piezoelectric layer 130 may be grown from a seed layer, as discussed above, according to various techniques compatible with semiconductor processes.

Figure 3E:
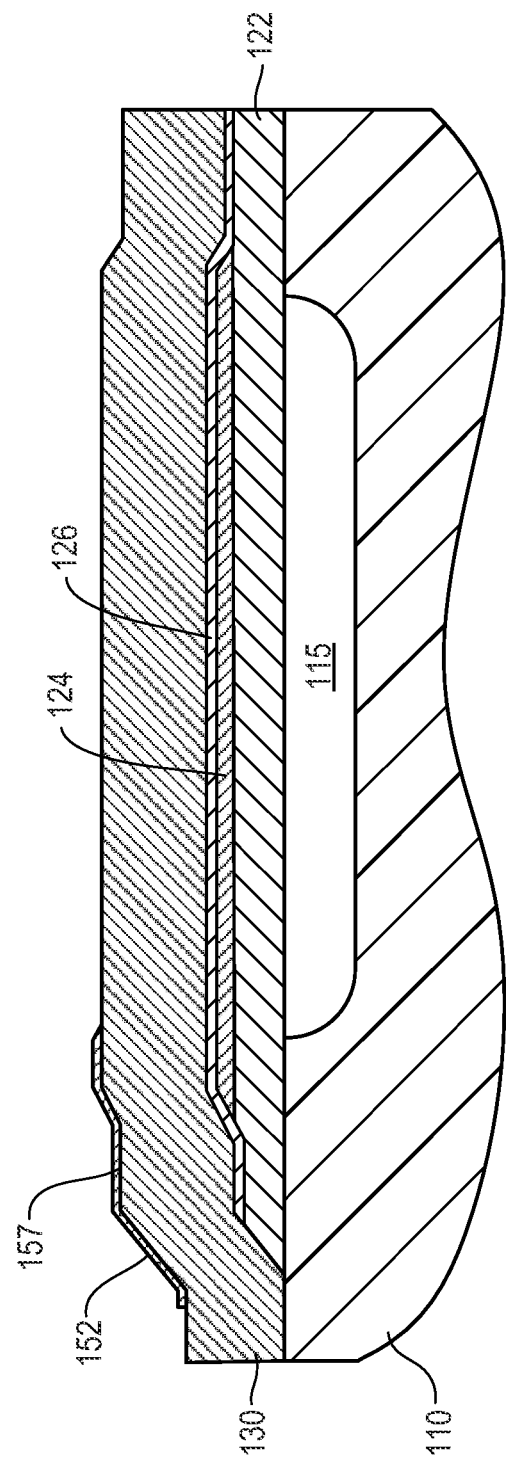

The second composite electrode 140 is formed on a top surface of the piezoelectric layer 130, as described below. However, as mentioned above, a portion of the second composite electrode forms bridge 150, which terminates an edge of the active area 108. In order to form the bridge 150, a bridge layer 152 of sacrificial material 157 is formed on a top surface of the piezoelectric layer 130, as shown in FIG. 3E. The sacrificial material 157 may be PSG, polysilicon or sputtered amorphous silicon, for example, which is released using a suitable etchant later in the fabrication process, as would be apparent to one of ordinary skill in the art. A mask pattern (not shown) is then applied to the bridge layer 152, which is then etched to the desired size. For example, a photoresist layer (not shown) may be applied to the top surface of the piezoelectric layer 130 and patterned to form a mask or photoresist pattern, using any phostoresist patterning technique compatible with semiconductor processes, as would be apparent to one of ordinary skill in the art. Following etching of the bridge layer 152, the photoresist pattern is removed, for example, by chemically releasing or etching using a wet etch process, although the photoresist pattern may be removed by various other techniques without departing from the scope of the present teachings.

Figure 3G:
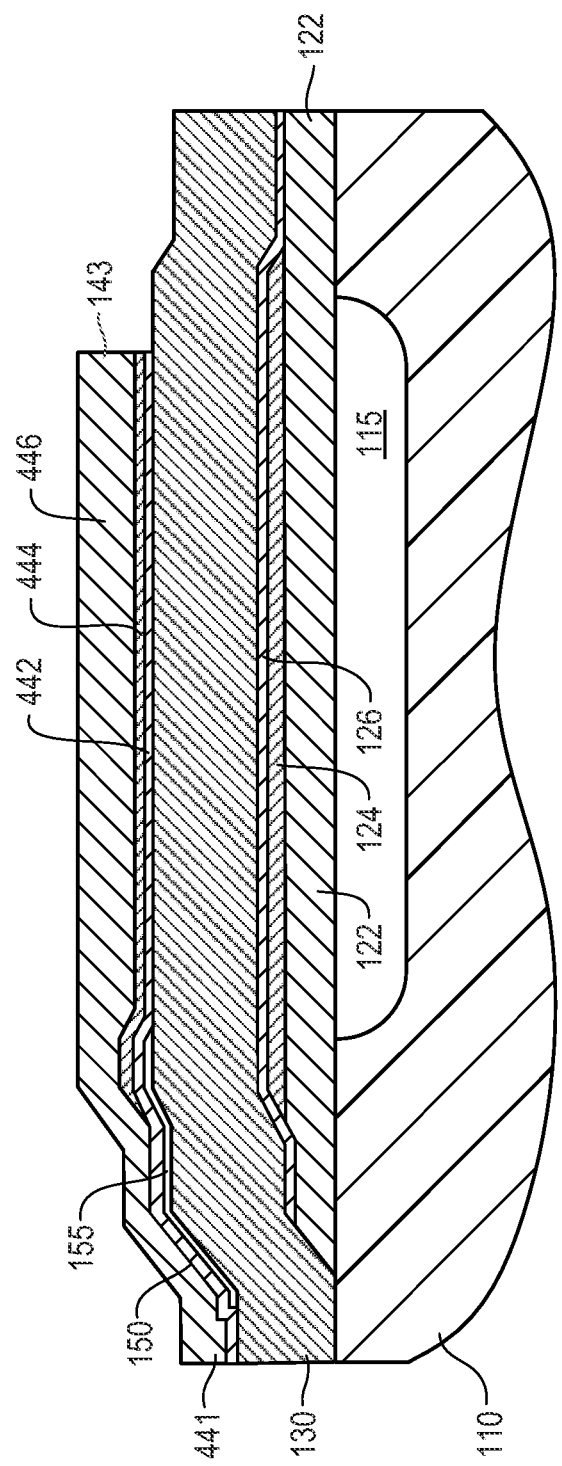

Referring to FIG. 3F, the second composite electrode 140 is formed by first forming third electrically conductive layer 142 on a top surface of the piezoelectric layer 130 and the bridge layer 152. The third electrically conductive layer 142 is formed of Mo, for example, although different materials may be used, as discussed above, without departing from the scope of the present teachings. The third electrically conductive layer 142 may be applied using spin-on, sputtering, evaporation, PVD or CVD techniques, for example, although other application methods may be incorporated. A mask pattern (not shown) is then applied to the third electrically conductive layer 142, which is then etched to form the desired shape as depicted in FIG. 3G. The mask is then removed. As discussed above, any masking and etching technique compatible with semiconductor processes may be incorporated, as would be apparent to one of ordinary skill in the art.

Referring again to FIG. 3G, the buried second temperature compensating layer 144 and the fourth electrically conductive layer 146 are formed in substantially the same manner as discussed above with regard to the buried first temperature compensating layer 124 and the second electrically conductive layer 126. The fourth electrically conductive layer 146 is formed of W and the buried second temperature compensating layer 144 is formed of polycrystalline silicon, for example, although different materials may be used, as discussed above, without departing from the scope of the present teachings. Also, the buried second temperature compensating layer 144 may be etched to include tapered edge 144a, as discussed above with regard to the tapered edge 124a of the buried first temperature compensating layer 124. Notably, because the buried second temperature compensating layer 144 is on top of the piezoelectric layer 130 (as opposed to being buried in the first composite electrode 120), in line ion milling may be performed in order to fine tune the second composite electrode 140 and the frequency of the acoustic stack 105, simultaneously.

After application of the third and fourth electrically conductive layers 142 and 146 and the buried second temperature compensating layer 144, a vertical etch is performed to form the edge (e.g., the non-connection edge 143) of the second composite electrode 140, which also terminates an edge of the active area 108 (opposite the edge of the active area 108 terminated by the bridge 150). For example, a photoresist layer (not shown) may be applied to the top surface of the fourth electrically conductive layer 146 and patterned to form a mask or photoresist pattern, using any phostoresist patterning technique compatible with semiconductor processes, as would be apparent to one of ordinary skill in the art. The photoresist pattern may be formed by machining or by chemically etching the photoresist layer using photolithography, although various alternative techniques may be incorporated. Following etching of the third and fourth electrically conductive layers 142 and 146 and the buried second temperature compensating layer 144, the photoresist pattern is removed, for example, by chemically releasing or etching using a wet etch process, although the photoresist pattern may be removed by various other techniques without departing from the scope of the present teachings. In various embodiments, the second composite electrode 140 may further include a passivation layer (not shown) formed of BSG, $SiO_2$, SiN, polysilicon, or the like.

Also as shown in FIG. 3G, the sacrificial material 117 in the cavity 115 and the sacrificial material 157 of the bridge layer 152 are released to form the cavity 115 and the bridge 150 (over air gap 155), respectively. For example, when the sacrificial material 117 is polysilicon and the sacrificial material 157 is polysilicon or sputtered amorphous silicon, they each may be released using xenon difluoride ($XeF_2$) in a dry release process. Various illustrative techniques for forming bridges are described, for example, in the referenced U.S. patent and Published patent application to Choy, et al., referenced above, as well as: U.S. Patent Application Publication No. 20120218056 to Dariusz Burak; U.S. Patent Application Publication No. 20120218055 to Dariusz Burak, et al.; U.S. Patent Application Publication No. 20120161902 to Chris Feng, et al.; U.S. Patent Application Publication No. 20120218059 to Dariusz Burak, et al.; U.S. Patent Application Publication No. 20120218058 to Dariusz Burak, et al.; U.S. Patent Application No. 20120218060 to Dariusz Burak, et al.; and U.S. patent application Ser. No. 13/168,101 to Alexandre Shirakawa, et al. The entire disclosures of the U.S. patent applications and U.S. patent application Publication listed above are specifically incorporated by reference.

In various embodiments, the acoustic resonator device 100 may be fabricated as part of a wafer. Thus, after completion, the acoustic resonator device 100 may be cut or separated from the wafer, to the extent necessary, in order to form a singulated die, e.g., as shown in FIGS. 1 and 3G. The acoustic resonator device 100 may be separated using various techniques compatible with semiconductor fabrication processes, such as scribe and break, for example.

Figure 4:
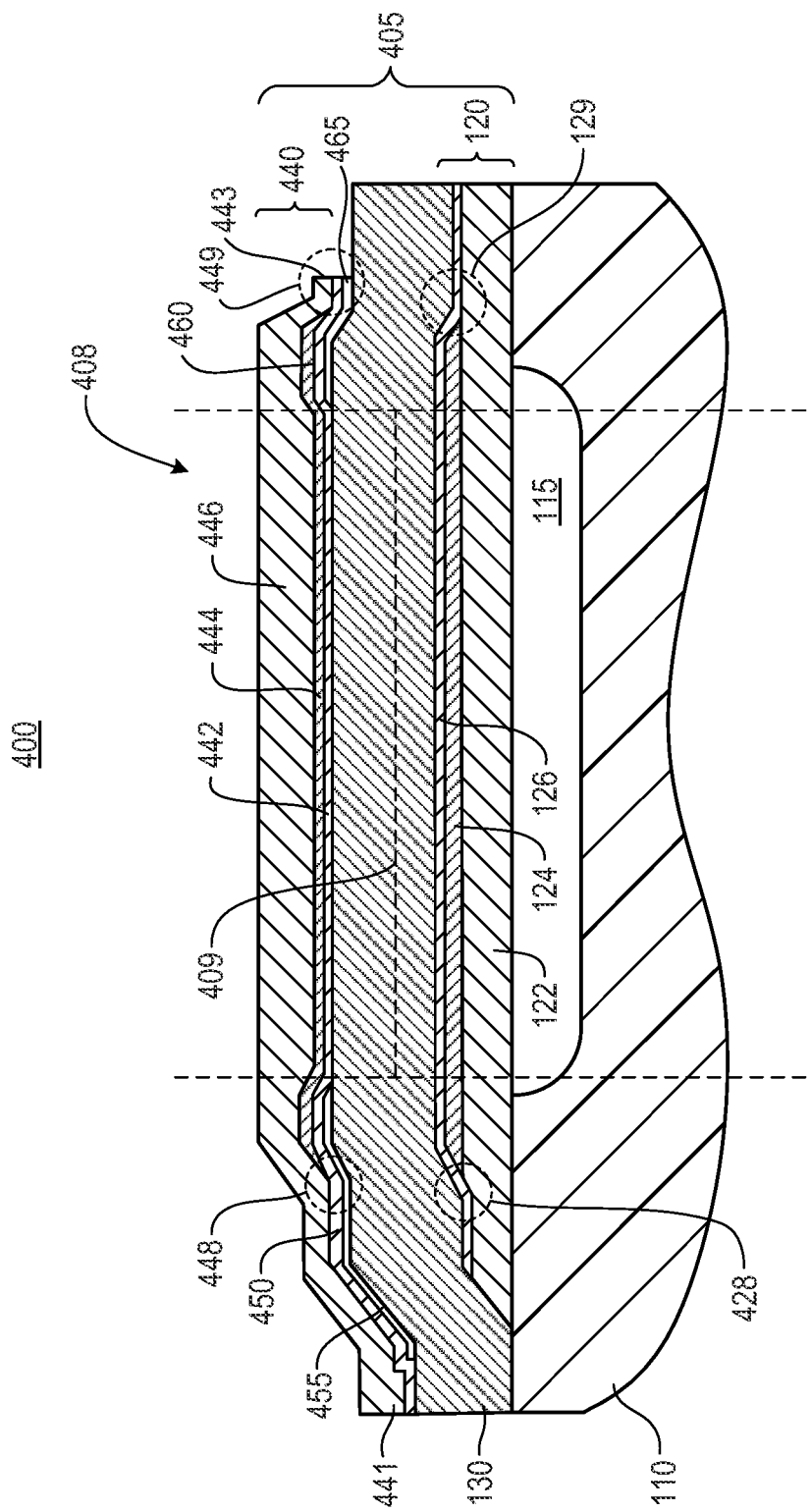
FIG. 4 is a cross-sectional diagram illustrating an acoustic resonator device according to another representative embodiment.

FIG. 4 is a cross-sectional view of a BAW resonator device, and more particularly, an FBAR in the depicted illustrative configuration, which includes composite electrodes having buried temperature compensating layers, according to another representative embodiment.

Referring to FIG. 4, illustrative acoustic resonator device 400 includes acoustic stack 405 formed on substrate 110. The acoustic stack 405 includes piezoelectric layer 130 formed between a first composite electrode 120 and a second composite electrode 440. Generally, the structure of the second composite electrode 440 is different from the structure of the second composite electrode 140 in FIG. 1. Like reference numerals in FIGS. 1 and 4 refer to like elements, and therefore corresponding descriptions of like elements will not be repeated.

In the depicted embodiment, the acoustic stack 405 includes piezoelectric layer 130 formed between a first composite electrode 120 and a second composite electrode 440. In the depicted embodiment, the substrate 110 includes an acoustic reflector, indicated by representative cavity 115 in the depicted embodiment, formed beneath the acoustic stack 405 to provide acoustic isolation. The acoustic stack 405 is suspended over an air space formed by the cavity 115 to enable mechanical movement. In alternative embodiments, the substrate 110 may be formed with no cavity 115, for example, using SMR technology. For example, the acoustic stack 405 may be formed over an acoustic mirror or a Bragg Reflector (not shown) formed on or in the substrate 110, as discussed above.

The first composite electrode 120 includes first base electrode layer or first electrically conductive layer 122, buried first temperature compensating layer 124, and second conductive interposer layer or second electrically conductive layer 126, stacked sequentially on the substrate 110. The first and second electrically conductive layers 122 and 126 are formed of electrically conductive materials, such as various metals compatible with semiconductor processes, including W, Mo, Al, Pt, Ru, Nb, or Hf, for example. The buried first temperature compensating layer 124 may be formed of various materials compatible with semiconductor processes, including polycrystalline silicon, BSG, $SiO_2$, Cr or $TeO_{(x)}$, for example, which have positive temperature coefficients. The piezoelectric layer 130 is formed on the top surface of the second electrically conductive layer 126, and may be formed of a thin film piezoelectric compatible with semiconductor processes, such as AlN, ZnO, PZT, or the like. As discussed above, the second electrically conductive layer 126 contacts the top surface of the first electrically conductive layer 122, as indicated for example by reference numerals 128 and 129, forming a DC electrical connection and thereby shorting out a capacitive component of the buried first temperature compensating layer 124 and increasing a coupling coefficient ($kt^2$) of the acoustic resonator device 400.

The second composite electrode 440 is formed on the top surface of the piezoelectric layer 130. The second composite electrode 440 includes a second conductive interposer layer or third electrically conductive layer 442, a buried second temperature compensating layer 444, and a second base electrode layer or fourth electrically conductive layer 446, stacked sequentially on the piezoelectric layer 130. The third electrically conductive layer 442 and the fourth electrically conductive layer 446 are formed of electrically conductive materials, such as various metals compatible with semiconductor processes, including W, Mo, Al, Pt, Ru, Nb, or Hf, for example. In various embodiments, the third electrically conductive layer 442 and the fourth electrically conductive layer 446 are formed of different conductive materials, where the fourth electrically conductive layer 446 is formed of a material having relatively lower conductivity and relatively higher acoustic impedance, and the third electrically conductive layer 442 is formed of a material having relatively higher conductivity and relatively lower acoustic impedance. For example, the fourth electrically conductive layer 446 may be formed of W and the third electrically conductive layer 442 may be formed of Mo, although other materials and/or combinations of materials may be used without departing from the scope of the present teachings. Further, in various embodiments, the third electrically conductive layer 442 and the fourth electrically conductive layer 446 may be formed of the same conductive material, without departing from the scope of the present teachings. The third and fourth electrically conductive layers 442 and 446 may be formed of the same or different materials than the first and second electrically conductive layers 122 and 126 of the first composite electrode, without departing from the scope of the present teachings.

The buried second temperature compensating layer 444 is formed between the third electrically conductive layer 442 and the fourth electrically conductive layer 446. The buried second temperature compensating layer 444 is therefore separated or isolated from the piezoelectric layer 130 by the third electrically conductive layer 442. Accordingly, the buried second temperature compensating layer 444 is effectively buried within the second composite electrode 440, including both edges, as discussed below. The buried second temperature compensating layer 444 may be formed of various materials compatible with semiconductor processes, including polycrystalline silicon, BSG, SiO2, Cr or $TeO_{(x)}$, for example, which have positive temperature coefficients. The positive temperature coefficient of the buried second temperature compensating layer 444 further offsets negative temperature coefficients of other materials in the acoustic stack 405, including the piezoelectric layer 130, the first composite electrode 120, and the third and fourth electrically conductive layers 442 and 446 of the second composite electrode 440.

As shown in the embodiment of FIG. 4, the second composite electrode 440 has a connection edge 441 and a non-connection edge 443. The connection edge 441 is on a side of the second composite electrode 440 configured to electrically connect to circuitry (not shown) to provide electrical signals to and/or from the acoustic resonator device 400. Also, a portion of the second composite electrode 440 extending toward the connection edge 441 includes bridge 450 over air gap 455. The bridge 450 is formed between the top surface of the piezoelectric layer 130 and the bottom surface of the second composite electrode 440 (more particularly, the bottom surface of the third electrically conductive layer 442).

Similarly, another portion of the second composite electrode 440 extending toward the non-connection edge 443 includes cantilever 460 over air gap 465. The cantilever 460 is also formed between the top surface of the piezoelectric layer 130 and the bottom surface of the second composite electrode 440 (more particularly, the bottom surface of the third electrically conductive layer 442). Notably, unlike the air gap 455 formed by the bridge 450, the air gap 465 is open ended, such that the portion of the second composite electrode 440 extending toward the non-connection edge 443 is not connected (i.e., is cantilevered) to the end portion of the piezoelectric layer 130.

It is noted that although the bridge 450 and the cantilever 460 each provide improved performance to the acoustic resonator device 400 (see for example the above-referenced patent and patent application to Choy, et al.), the bridge 450 and the cantilever 460 are not essential to the acoustic resonator device 400, and the present teachings contemplate acoustic resonators that do not include the bridge 150, or the cantilever 460, or both.

The acoustic stack 405 includes an active area 408, indicated by dashed lines. The active area 408 is terminated at the beginning of the bridge 450 and at the beginning of the cantilever 460 of the second composite electrode 440. The bridge 450 and the cantilever 460 effectively separate dead resonator areas of the acoustic resonator device 400 from the active area 408. The acoustic stack 405 within the active area 408 is substantially symmetrical about horizontal axis 409, as discussed above with respect to active area 108 in FIG. 1. The horizontal axis 409 passes substantially along the center of a thickness of the piezoelectric layer 130. Notably, various factors such as manufacturing processes and application of seeding, mass loading and/or passivation layers may cause slight differences in structure on either side of the horizontal axis 409, such that the acoustic stack 405 may not be precisely symmetrical about the horizontal axis 409. Generally, though, the acoustic stack 405 within the active area 408 is more symmetrical than in a resonator device having only one composite electrode. As a result of the improved symmetry, negative effects of second overtone and higher order spurious modes are minimized.

The fourth electrically conductive layer 446, which is formed on the top surface of the buried second temperature compensating layer 444, contacts the top surface of the third electrically conductive layer 442, as indicated for example by reference numerals 448 and 449. Therefore, DC electrical connections are formed between the third and fourth electrically conductive layers 442 and 446, which effectively "shorts" out a capacitive component of the buried second temperature compensating layer 444, thus further increasing a coupling coefficient ($kt^2$) of the acoustic resonator device 400. In addition, the third electrically conductive layer 442 provides a barrier between the buried second temperature compensating layer 444 and the piezoelectric layer 130.

In the depicted embodiment, the buried second temperature compensating layer 444 has tapered edges 444a, which enhance the DC electrical and mechanical connections between the third and fourth electrically conductive layers 442 and 446. In alternative embodiments, the edges of the buried second temperature compensating layer 444 are not tapered, but may be substantially perpendicular to the top and bottom surfaces of the buried second temperature compensating layer 444, for example, without departing from the scope of the present teachings.

The second composite electrode 440 may further include a passivation layer (not shown) on a top surface, which may be formed of various types of materials, including AlN, SiC, BSG, SiO2, SiN, polysilicon, and the like. The thickness of the passivation layer must be sufficient to insulate all layers of the acoustic stack 405 from the environment, including protection from moisture, corrosives, contaminants, debris and the like. The first and second composite electrodes 120 and 440 may be electrically connected to external circuitry via contact pads (not shown), which may be formed of a conductive material, such as gold, gold-tin alloy or the like.

In an embodiment, an overall first thickness of the first composite electrode 120 is substantially the same as an overall second thickness of the second composite electrode 440, as shown in FIG. 4. Also, the thicknesses of the first through fourth electrically conductive layers 122, 126, 442 and 446, as well as the thicknesses of the buried first and second temperature compensating layers 124 and 444, may vary in relation to one another, in order to optimize the coupling coefficient and overall temperature coefficient of the acoustic resonator device 400, as discussed above with reference to the acoustic resonator device 100. Likewise, the illustrative thicknesses discussed above may also apply to the acoustic resonator device 400 to provide unique benefits for any particular situation or to meet application specific design requirements of various implementations, as would be apparent to one of ordinary skill in the art.

According to various embodiments, the resonator device may be fabricated using various techniques compatible with semiconductor processes. A non-limiting example of a fabrication process directed to representative acoustic resonator device 400 is discussed below with reference to FIGS. 5A-5E, which are cross-sectional views of a BAW resonator device in various stages of the fabrication process, according to a representative embodiment.

FIG. 5A is substantially the same as FIG. 3D, discussed above. Thus, it is understood that the fabrication process steps leading to the structure shown in FIG. 5A are substantially the same as discussed above with reference to FIGS. 3A-3D, and therefore this description will not be repeated. Referring to FIG. 5A, substrate 110 includes cavity 115, which has been initially filled with sacrificial material 117, such as PSG or polysilicon, which is released using a suitable etchant later in the fabrication process, e.g., after application of the layers of the acoustic stack 405, as would be apparent to one of ordinary skill in the art. The first composite electrode 120 has been formed, including the first electrically conductive layer 122, the buried first temperature compensating layer 124, and the second electrically conductive layer 126, stacked sequentially on the substrate 110 over the cavity 115. The piezoelectric layer 130 has been formed on the top surface of the first composite electrode 120 (and a portion of the substrate 110).

Referring to FIG. 5B, a portion of the second composite electrode 440 forms bridge 450 and cantilever 460, which terminates edges of the active area 408, as mentioned above. In order to form the bridge 450 and the cantilever 460, a sacrificial layer (not shown) of sacrificial material 457 is formed on a top surface of the piezoelectric layer 130. The sacrificial material 457 may be PSG, polysilicon or sputtered amorphous silicon, for example, which is released using a suitable etchant later in the fabrication process, as would be apparent to one of ordinary skill in the art. A mask pattern (not shown) is then applied to the sacrificial material 457, which is then etched to the desired size, forming bridge layer 452 and cantilever layer 462. For example, a photoresist layer (not shown) may be applied to the top surface of the piezoelectric layer 130 and patterned to form a mask or photoresist pattern, using any phostoresist patterning technique compatible with semiconductor processes, as would be apparent to one of ordinary skill in the art. Following etching of the sacrificial material 457, the photoresist pattern is removed, for example, by chemically releasing or etching using a wet etch process including HF etch solution, although the photoresist pattern may be removed by various other techniques, without departing from the scope of the present teachings.

Referring to FIG. 5C, the second composite electrode 440 is formed by first forming third electrically conductive layer 442 on a top surface of the piezoelectric layer 130 and the bridge layer 452 and the cantilever layer 462. The third electrically conductive layer 442 is formed of Mo, for example, although different materials may be used, as discussed above, without departing from the scope of the present teachings. The third electrically conductive layer 442 may be applied using spin-on, sputtering, evaporation, PVD or CVD techniques, for example, although other application methods may be incorporated.

Referring again to FIG. 5D, the buried second temperature compensating layer 444 is formed in substantially the same manner as discussed above with regard to the buried first temperature compensating layer 124. The buried second temperature compensating layer 444 is formed of polycrystalline silicon, for example, although different materials may be used without departing from the scope of the present teachings. Also, the buried second temperature compensating layer 444 may be etched to include tapered edges 444a, as discussed above with regard to the tapered edge 124a of the buried first temperature compensating layer 124. A mask pattern (not shown) is applied to the buried second temperature compensating layer 444, which is then etched to form the desired shape as depicted in FIG. 5D. The mask is then removed. As discussed above, any masking and etching technique compatible with semiconductor processes may be incorporated, as would be apparent to one of ordinary skill in the art.

Figure 5E:
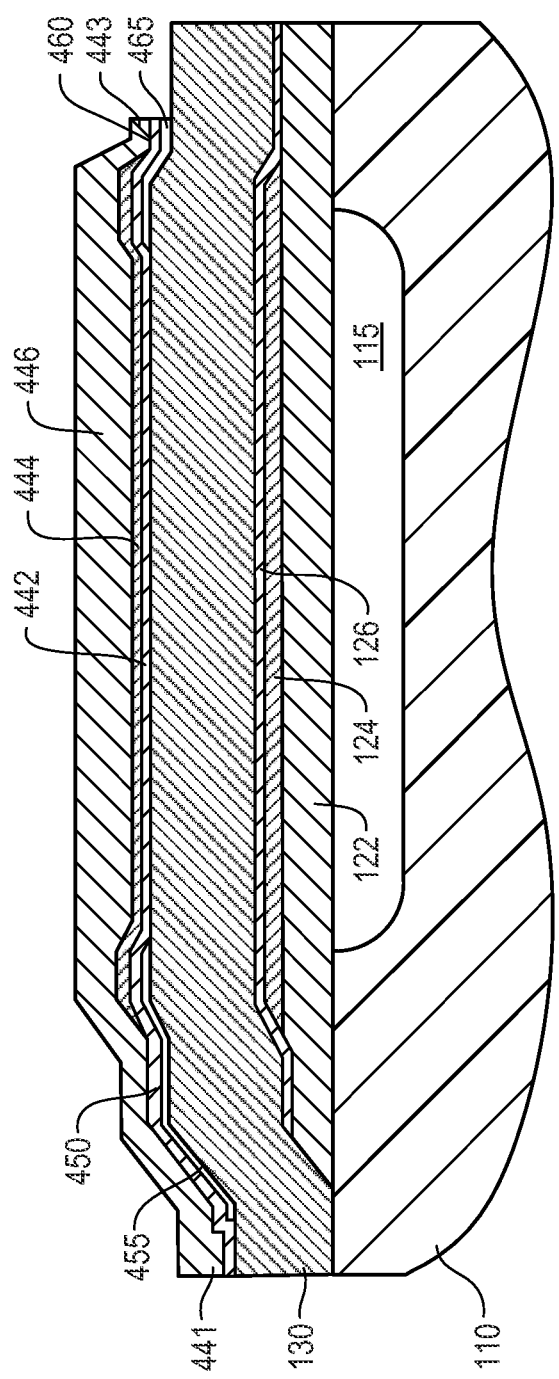

Referring to FIG. 5E, fourth electrically conductive layer 446 is formed on a top surface of the buried second temperature compensation layer 444. The fourth electrically conductive layer 446 is formed of W, for example, although different materials may be used, as discussed above, without departing from the scope of the present teachings. The fourth electrically conductive layer 446 may be applied using spin-on, sputtering, evaporation, PVD or CVD techniques, for example, although other application methods may be incorporated. After application of the third and fourth electrically conductive layers 442 and 446 and the buried second temperature compensating layer 444, a vertical etch is performed to form the edge (e.g., the non-connection edge 143) of the second composite electrode 440. Unlike the embodiment depicted in FIG. 3G, for example, the vertical etch in FIG. 5E does not terminate an edge of the active area 408. Rather, the beginning of the cantilever 460 terminates the edge of the active area 408, opposite the edge of the active area 408 terminated by the bridge 450. For example, a photoresist layer (not shown) may be applied to the top surface of the fourth electrically conductive layer 446 and patterned to form a mask or photoresist pattern, using any phostoresist patterning technique compatible with semiconductor processes, as would be apparent to one of ordinary skill in the art. The photoresist pattern may be formed by machining or by chemically etching the photoresist layer using photolithography, although various alternative techniques may be incorporated. Following etching of the third and fourth electrically conductive layers 442 and 446 and the buried second temperature compensating layer 444, the photoresist pattern is removed, for example, by chemically releasing or etching using a known wet etch process, although the photoresist pattern may be removed by various other techniques without departing from the scope of the present teachings. In various embodiments, the second composite electrode 440 may further include a passivation layer (not shown) formed of BSG, SiO2, SiN, polysilicon, or the like.

Also as shown in FIG. 5E, the sacrificial material 117 in the cavity 115 is released to form the cavity 115, and the sacrificial material 457 of the bridge layer 452 and the cantilever layer 462 are released to form the bridge 450 (over air gap 455) and the cantilever 460 (over air gap 465), respectively. For example, when the sacrificial material 117 is polysilicon or amorphous silicon and the sacrificial material 457 is sputtered amorphous silicon, they each may be released using $XeF_2$ in a dry release process. Alternatively, the sacrificial material 457 and 117 may be PSG, in which case it may be released using HF in a wet release process.

In various embodiments, the acoustic resonator device 400 may be fabricated as part of a wafer. Thus, after completion, the acoustic resonator device 400 may be cut or separated from the wafer, to the extent necessary, in order to form a singulated die, e.g., as shown in FIGS. 4 and 5E. The acoustic resonator device 400 may be separated using various techniques compatible with semiconductor fabrication processes, such as scribe and break, for example.

According to various embodiments, an acoustic stack of a resonator device has at least one composite electrode that includes a buried temperature compensating layer separated from a piezoelectric layer by a conductive interposer layer. The temperature compensating layer has a temperature coefficient that has an opposite sign from a temperature coefficient of at least one other element in the acoustic stack, thus offsetting the effects of that temperature coefficient. Further, the conductive interposer layer effectively shorts out a capacitive component of the temperature compensating layer, which effectively increases a coupling coefficient of the resonator device. Accordingly, this enables more stable operation of the resonator, for example, by preventing shifts in passband due to increases in temperature, while preventing contamination of the piezoelectric material by the material in the temperature compensating layer.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. An acoustic resonator device, comprising:
a substrate:
a first composite electrode disposed over the substrate, the first composite electrode comprising first and second electrically conductive layers and a first temperature compensating layer disposed between the first and second electrically conductive layers, wherein the second electrically conductive layer forms a first electrical contact with the first electrically conductive layer on at least one side of the first temperature compensating layer, the first electrical contact electrically shorting a first capacitive component of the first temperature compensating layer;
a piezoelectric layer disposed over the first composite electrode;
a second composite electrode disposed over the piezoelectric layer, the second composite electrode comprising third and fourth electrically conductive layers and a second temperature compensating layer disposed between the third and fourth electrically conductive layers, wherein the fourth electrically conductive layer forms a second electrical contact with the third electrically conductive layer on at least one side of the second temperature compensating layer, the second electrical contact electrically shorting a second capacitive component of the second temperature compensating layer; and
an acoustic reflector disposed beneath the first composite electrode.

2. The acoustic resonator device as claimed in claim 1, wherein the acoustic reflector comprises a cavity disposed in the substrate.

3. The acoustic resonator device as claimed in claim 1, wherein the acoustic reflector comprises an acoustic minor disposed in or over the substrate.

4. The acoustic resonator device as claimed in claim 1. wherein the first electrically conductive layer comprises a first metal layer formed on the substrate, and the second electrically conductive layer comprises a second metal layer disposed on the first temperature compensating layer.

5. The acoustic resonator as claimed in claim wherein the third electrically conductive layer comprises a third metal layer disposed on the piezoelectric layer, and the fourth electrically conductive layer comprises a fourth metal layer disposed on the second temperature compensating layer.

6. The acoustic resonator as claimed in claim 1, wherein the first and second temperature compensating layers each comprise polycrystalline silicon.

7. The acoustic resonator as claimed in claim 4, wherein the first metal layer comprises tungsten and the second metal layer comprises molybdenum.

8. The acoustic resonator as claimed in claim 5, wherein the third metal layer comprises molybdenum and the fourth metal layer comprises tungsten.

9. The acoustic resonator as claimed in claim 1. wherein the second composite electrode comprises a side configured to form an electrical connection, and at least one other side that forms a cantilever.

10. The acoustic. resonator as claimed in claim 9, wherein the side that forms the electrical connection comprises a bridge.

11. The acoustic resonator as claimed in claim 10, wherein an active area of the acoustic resonator is terminated at the bridge and at the cantilever.

12. An acoustic resonator device, comprising:
a substrate;
a first composite electrode disposed over the substrate, the first composite electrode comprising first and second electrically conductive layers and a first temperature compensating layer disposed between the first and second electrically conductive layers;
a piezoelectric layer disposed over the first composite electrode, the piezoelectric layer having as thickness;
a second composite electrode disposed over the piezoelectric layer, the second composite electrode comprising third and fourth electrically conductive layers and a second temperature compensating layer disposed between the third and fourth electrically conductive layers, the second composite electrode comprising a side configured to form an electrical connection, and at least one other side that forms a cantilever; and
an acoustic reflector disposed beneath the first composite electrode, wherein the first and second composite electrodes are symmetrically disposed about an axis of symmetry passing substantially along a center of the thickness of the piezoelectric layer.

13. The acoustic resonator device, as claimed in claim 12. wherein the first electrically conductive layer comprises a first metal layer formed on the substrate, and the second electrically conductive layer comprises a second metal layer disposed on the first temperature compensating layer.

14. The acoustic resonator as claimed in claim 12, wherein the third electrically conductive layer comprises a third metal layer disposed on the piezoelectric layer, and the fourth electrically conductive layer comprises a fourth metal layer disposed on the second temperature compensating layer.

15. The acoustic resonator as claimed in claim 12, wherein the side that forms the electrical connection comprises a bridge.

16. The acoustic resonator as claimed in claim 15, wherein an active area of the acoustic resonator is terminated at the bridge and at the cantilever.

17. The acoustic resonator as claimed in claim 12, wherein the first temperature compensating layer, or the second temperature compensating layer, or both has tapered edges.

18. An acoustic resonator device, comprising:
a substrate;
a first composite electrode disposed over the substrate, the first composite electrode comprising, first and second electrically conductive layers and a first temperature compensating layer disposed between the first and second electrically conductive layers;
a piezoelectric layer disposed over the first composite electrode, the piezoelectric layer having a thickness;
a second composite electrode disposed over the piezoelectric layer, the second composite electrode comprising third and fourth electrically conductive layers and a second temperature compensating layer disposed between the third and fourth electrically conductive layers; and
an acoustic reflector disposed beneath the first composite electrode, the first and second composite electrodes being symmetrically disposed about an axis of symmetry passing substantially along a center of the thickness of the piezoelectric layer, wherein no acoustic decoupler layer is disposed between the first and second composite electrodes.

19. The acoustic resonator device as claimed in claim 18, wherein the acoustic reflector comprises a cavity disposed in the substrate.

20. The acoustic resonator device as claimed in claim 18, wherein the acoustic reflector comprises an acoustic mirror disposed in or over the substrate.

21. The acoustic resonator device as claimed in claim 18, wherein the first electrically conductive layer comprises a first metal layer formed on the substrate, and the second electrically conductive layer comprises a second metal layer disposed on the first temperature compensating, layer.

22. The acoustic resonator as claimed in claim 18, wherein the third electrically conductive layer comprises a third metal layer disposed on the piezoelectric layer, and the fourth electrically conductive layer comprises a fourth metal layer disposed on the second temperature compensating layer.

23. The acoustic resonator as claimed in claim 18, wherein the first and second temperature compensating layers each comprise polycrystalline silicon.

24. The acoustic resonator as claimed in claim 21, wherein the first metal layer comprises tungsten and the second metal layer comprises molybdenum.

25. The acoustic resonator as claimed in claim 22, wherein the third metal layer comprises molybdenum and the fourth metal layer comprises tungsten.

26. The acoustic resonator as claimed in claim 18, wherein the second composite electrode comprises a side configured to form an electrical connection, and at least one other side that forms a cantilever.

27. The acoustic resonator as claimed in claim 26, wherein the side that forms the electrical connection comprises a bridge.

28. The acoustic resonator as claimed in claim 27, wherein an active area of the acoustic resonator is terminated at the bridge and at the cantilever.

29. An acoustic resonator device, comprising:
a substrate;
a first composite electrode disposed over the substrate, the first composite electrode comprising first and second electrically conductive layers and a first temperature compensating layer disposed between the first and second electrically conductive layers;
a piezoelectric layer disposed over the first composite electrode, the piezoelectric layer having a thickness;
a second composite electrode disposed over the piezoelectric layer, the second composite electrode comprising third and fourth electrically conductive layers and a second temperature compensating layer disposed between the third and fourth electrically conductive layers, wherein no acoustic decoupler layer is disposed between the first and second composite electrodes; and
an acoustic reflector disposed beneath the first composite electrode, the first and second composite electrodes being symmetrically disposed about an axis of symmetry passing substantially along a center of the thickness of the piezoelectric layer, wherein the first temperature compensating layer, or the second temperature compensating layer, or both, has tapered edges.

30. The acoustic resonator device as claimed in claim 29, wherein the acoustic reflector comprises a cavity disposed in the substrate.

31. The acoustic resonator device as claimed in claim 29, wherein the acoustic reflector comprises an acoustic mirror disposed in or over the substrate.

32. The acoustic resonator device as claimed in claim 29, wherein the first electrically conductive layer comprises a first metal layer formed on the substrate, and the second electrically conductive layer comprises a second metal layer disposed on the first temperature compensating layer.

33. The acoustic resonator as claimed in claim 29, wherein the third electrically conductive layer comprises a third metal layer disposed on the piezoelectric layer, and the fourth electrically conductive layer comprises a fourth metal layer disposed on the second temperature compensating layer.

34. The acoustic resonator as claimed in claim 29, wherein the first and second temperature compensating layers each comprise polycrystalline silicon.

35. The acoustic. resonator as claimed in claim 32, wherein the first metal layer comprises tungsten and the second metal, layer comprises molybdenum.

36. The acoustic resonator as claimed in claim 35, wherein the third metal layer comprises molybdenum and the fourth metal layer comprises tungsten.

37. The acoustic resonator as claimed in claim 29, wherein the second composite electrode comprises a side configured to form an electrical connection, and at least one other side that forms a cantilever.

38. The acoustic resonator as claimed in claim 37, wherein the side that forms the electrical connection comprises a bridge.

39. The acoustic resonator as claimed in claim 38, wherein an active area of the acoustic resonator is terminated at the bridge and at the cantilever.

40. An acoustic resonator device, comprising:
a substrate;

a first composite electrode disposed over the substrate, the first composite electrode comprising first and second electrically conductive layers and a first temperature compensating layer disposed between the first and second electrically conductive layers;

a piezoelectric layer disposed over the first composite electrode, the piezoelectric layer having a thickness;

a second composite electrode disposed over the piezoelectric layer, the second composite electrode comprising third and fourth electrically conductive layers and a second temperature compensating layer disposed between the third and fourth electrically conductive layers, wherein the second composite electrode comprises a side configured to form an electrical connection, and at least one other side that forms a cantilever; and an acoustic reflector disposed beneath the first composite electrode, the first and second composite electrodes being symmetrically disposed about an axis of symmetry passing substantially along a center of the thickness of the piezoelectric layer, wherein the first temperature compensating layer, or the second temperature compensating layer, or both, has tapered edges.

41. The acoustic resonator device as claimed in claim 40, wherein the acoustic reflector comprises a cavity disposed in the substrate.

42. The acoustic resonator device as claimed in claim 40, wherein the acoustic reflector comprises an acoustic mirror disposed in or over the substrate.

43. The acoustic resonator device as claimed in claim 40, wherein the first electrically conductive layer comprises a first metal layer formed on the substrate, and the second electrically conductive layer comprises a. second metal layer disposed on the first temperature compensating layer.

44. The acoustic resonator as claimed in claim 40, wherein the third electrically conductive layer comprises a third metal layer disposed on the piezoelectric layer, and the fourth electrically conductive layer comprises a fourth metal layer disposed on the second temperature compensating layer.

45. The acoustic resonator as claimed in claim 40, wherein the first and second temperature compensating layers each comprise polycrystalline silicon.

46. The acoustic resonator as claimed in claim 45, wherein the first metal layer comprises tungsten and the second metal layer comprises molybdenum.

47. The acoustic resonator as claimed in claim 46, wherein the third metal layer comprises molybdenum and the fourth metal layer comprises tungsten.

48. The acoustic resonator as claimed in claim 29, wherein the side that forms the electrical connection comprises a bridge.

49. The acoustic resonator as claimed in claim 48, wherein an active area of the acoustic resonator is terminated at the bridge and at the cantilever.

* * * * *